United States Patent
Lu et al.

(10) Patent No.: US 8,980,701 B1
(45) Date of Patent: Mar. 17, 2015

(54) METHOD OF FORMING SEMICONDUCTOR DEVICE

(71) Applicant: United Microelectronics Corp., Hsin-Chu (TW)

(72) Inventors: Shui-Yen Lu, Tainan (TW); Chih-Ho Wang, Tainan (TW); Jhen-Cyuan Li, New Taipei (TW)

(73) Assignee: United Microelectronics Corp., Science-Based Industrial Park, Hsin-Chu (TW)

( * ) Notice: Subject to any disclaimer, the term of this patent is extended or adjusted under 35 U.S.C. 154(b) by 17 days.

(21) Appl. No.: 14/071,672

(22) Filed: Nov. 5, 2013

(51) Int. Cl.
| | | |
|---|---|---|
| *H01L 21/00* | (2006.01) | |
| *H01L 29/66* | (2006.01) | |
| *H01L 21/02* | (2006.01) | |
| *H01L 29/423* | (2006.01) | |
| *H01L 21/84* | (2006.01) | |

(52) U.S. Cl.
CPC .... *H01L 29/66795* (2013.01); *H01L 21/02274* (2013.01); *H01L 21/0212* (2013.01); *H01L 21/02167* (2013.01); *H01L 21/0217* (2013.01); *H01L 29/42364* (2013.01); *H01L 21/845* (2013.01)
USPC .......................................... 438/151; 438/303

(58) Field of Classification Search
CPC ..... H01L 21/84; H01L 21/845; H01L 29/785; H01L 29/66795
USPC .......................... 438/595, 151, 154, 299, 303
See application file for complete search history.

(56) References Cited

U.S. PATENT DOCUMENTS

| | | | |
|---|---|---|---|
| 6,043,138 A | 3/2000 | Ibok | |
| 6,492,216 B1 | 12/2002 | Yeo | |
| 6,921,963 B2 | 7/2005 | Krivokapic | |
| 7,087,477 B2 | 8/2006 | Fried | |
| 7,091,551 B1 | 8/2006 | Anderson | |
| 7,247,887 B2 | 7/2007 | King | |
| 7,250,658 B2 | 7/2007 | Doris | |
| 7,309,626 B2 | 12/2007 | Ieong | |
| 7,352,034 B2 | 4/2008 | Booth, Jr. | |
| 7,470,570 B2 | 12/2008 | Beintner | |
| 7,531,437 B2 | 5/2009 | Brask | |
| 7,569,857 B2 | 8/2009 | Simon et al. | |
| 8,440,511 B1 * | 5/2013 | Liao et al. ...................... | 438/157 |
| 8,664,060 B2 * | 3/2014 | Liu et al. ....................... | 438/229 |
| 8,796,695 B2 * | 8/2014 | Liao et al. ........................ | 257/77 |
| 8,802,521 B1 * | 8/2014 | Hung et al. .................... | 438/197 |
| 8,853,013 B2 * | 10/2014 | Tsai et al. ...................... | 438/151 |
| 8,877,623 B2 * | 11/2014 | Tsai et al. ...................... | 438/589 |
| 2004/0195624 A1 | 10/2004 | Liu | |
| 2005/0051825 A1 | 3/2005 | Fujiwara | |
| 2006/0099830 A1 | 5/2006 | Walther | |
| 2006/0286729 A1 | 12/2006 | Kavalieros | |
| 2007/0108528 A1 | 5/2007 | Anderson | |
| 2007/0158756 A1 | 7/2007 | Dreeskornfeld | |

(Continued)

*Primary Examiner* — Kevin M Picardat
(74) *Attorney, Agent, or Firm* — Winston Hsu; Scott Margo (57) ABSTRACT

A method of forming a semiconductor device includes the following steps. At least a fin structure is provided on a substrate and a gate structure partially overlapping the fin structure is formed. Then, a dielectric layer is formed on the substrate. Subsequently, a first etching process is performed to remove apart of the dielectric layer to form a first spacer surrounding the gate structure and a second spacer surrounding a sidewall of the fin structure, and a protective layer is formed in-situ to cover the gate structure and the first spacer. Finally, a second etching process is performed to remove a part of the protective layer and totally remove the second spacer.

20 Claims, 5 Drawing Sheets

(56) References Cited

U.S. PATENT DOCUMENTS

| | | |
|---|---|---|
| 2008/0157208 A1 | 7/2008 | Fischer |
| 2009/0124097 A1 | 5/2009 | Cheng |
| 2009/0242964 A1 | 10/2009 | Akil |
| 2009/0269916 A1 | 10/2009 | Kang |
| 2010/0048027 A1 | 2/2010 | Cheng |
| 2010/0072553 A1 | 3/2010 | Xu |
| 2010/0144121 A1 | 6/2010 | Chang |
| 2010/0167506 A1 | 7/2010 | Lin |

* cited by examiner

METHOD OF FORMING SEMICONDUCTOR DEVICE

BACKGROUND OF THE INVENTION

1. Field of the Invention

The present invention relates generally to a method of forming a semiconductor device, and more particularly, to a method of forming a semiconductor device including a gate structure disposed on a fin structure with a light spacer pull down.

2. Description of the Prior Art

With the increasing miniaturization of semiconductor devices, various Fin-shaped field effect transistor (FinFET) devices have been developed. The Fin-shaped field effect transistor (FinFET) is advantageous for the following reasons. First, manufacturing processes of Fin-shaped field effect transistor (FinFET) devices are similar to traditional logic device processes, and thus are more compatible. In addition, since the three-dimensional structure of the FinFET increases the overlapping area between the gate and the fin, the channel region is controlled more effectively. This reduces a drain-induced barrier lowering (DIBL) effect and short channel effect. Moreover, the channel region is bigger for the same gate width, which means that the current between the source and the drain is increased.

In a current FinFET process, a gate structure (which may include a gate dielectric layer, a gate conductive layer located on the gate dielectric layer, and a cap layer located on the gate conductive layer) is formed on a substrate having at least a fin-shaped structure. A dielectric material layer is formed and a blanket etching process is performed to partially remove the dielectric material layer, so that a spacer is formed beside the gate structure.

After the formation of the spacer, an unwanted dielectric material layer remains may exist at the sidewall of the fin-shaped structure. To prevent the formation of the dielectric material layer remains, an etchant/chemical solvent which has a high removal rate or a long etching process time can be used in the blanket etching process to form the spacer beside the gate structure. This may induce serious spacer pull down, however, which causes the gate conductive layer to be exposed. Accordingly, a semiconductor process—more specifically a FinFET process including a gate spacer process—that can simultaneously prevent remaining unwanted spacer material as well as reducing spacer pull down to thereby improve the performance and reliability of the semiconductor device is needed in the industry.

SUMMARY OF THE INVENTION

It is one of the objectives of the present invention to provide a method of forming a semiconductor device including a gate spacer process, in order to form a spacer besides a gate structure overlapping a fin structure, that can prevent serious spacer pull down and remaining unwanted spacer material at the sidewall of the fin structure.

According to one exemplary embodiment of the present invention, a method of forming a semiconductor device includes the following steps. At least a fin structure is provided on a substrate and a gate structure partially overlapping the fin structure is formed. Then, a dielectric layer is formed on the substrate. Subsequently, a first etching process is performed to remove apart of the dielectric layer to form a first spacer surrounding the gate structure and a second spacer surrounding a sidewall of the fin structure, and a protective layer is formed in-situ to cover the gate structure and the first spacer. Finally, a second etching process is performed to remove a part of the protective layer and totally remove the second spacer.

The present invention uses multiple etching processes including the first etching process (a main etching process) to form the first spacer (the gate spacer) and the second etching process (an over etching process) to totally remove the second spacer (the unwanted spacer material remains at the sidewall of the fin structure). Between the first etching process and the second etching process, the protective layer is formed to protect the first spacer in order to prevent serious spacer pull down during the second etching process. The first etching process, the protective layer formation process and the second etching process are preferably performed in the same reaction chamber to save on manufacturing consuming time. Accordingly, after the multiple etching processes, the first spacer (the gate spacer) can be properly formed beside the gate structure without exposing the gate conductive layer of the gate structure, and the unwanted second spacer at the sidewall of the fin structure can be totally removed.

These and other objectives of the present invention will no doubt become obvious to those of ordinary skill in the art after reading the following detailed description of the preferred embodiment that is illustrated in the various figures and drawings.

DETAILED DESCRIPTION

To provide a better understanding of the present invention, preferred exemplary embodiments will be described in detail. The preferred exemplary embodiments of the present invention are illustrated in the accompanying drawings with numbered elements.

Figure 1:
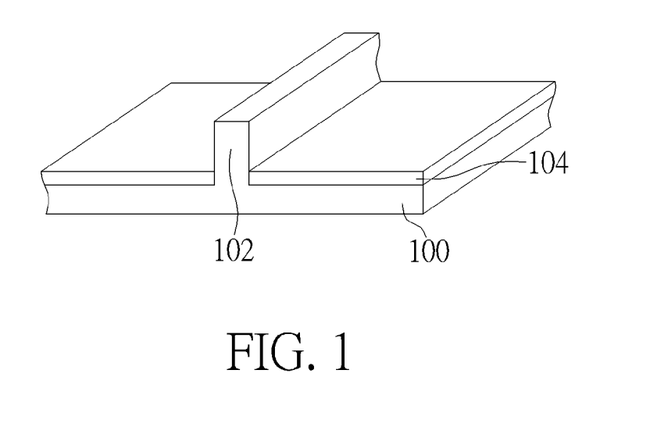
FIG. 1 through FIG. 9 illustrate a method of forming a semiconductor device according to an exemplary embodiment of the present invention

Please refer to FIG. 1 through FIG. 9, which illustrate a method of forming a semiconductor device according to an exemplary embodiment of the present invention. As shown in FIG. 1, a substrate 100 is provided, wherein the substrate 100 is a bulk substrate such as a silicon substrate, an epitaxial silicon substrate, a silicon germanium substrate, a silicon carbide substrate or a substrate made of semiconductor material, but is not limited thereto. A mask layer (not shown) is formed on the substrate, wherein the mask layer includes a pad oxide layer (not shown) and a nitride layer (not shown) located on the pad oxide layer. A photolithography process is first performed to pattern the mask layer for forming a patterned pad oxide layer (not shown) and a patterned nitride layer (not shown) and exposing a part of the substrate 100. Then, an etching process can be performed on the substrate 100 by using the patterned pad oxide layer and the patterned nitride layer as a hard mask, so that at least a fin structure 102 can be formed from the part of the substrate 100 that is not etched. In another exemplary embodiment, an epitaxial process is performed to form the desired fin structures on the exposed part of the substrate 100. The fin structure 102 may protrude from the patterned pad oxide layer and the patterned nitride layer. Subsequently, an insulating layer 104 such as an oxide layer is further formed on the substrate 100 except for the substrate 100 where the fin structure 102 is formed thereon, and the insulating layer 104 may be formed through processes such as a deposition process and an etching back process, to be later used as a shallow trench isolation (STI)

structure. Then, the patterned pad oxide layer and the patterned nitride layer are removed. Accordingly, the fin structure 102 can be formed on the substrate 100, and the insulating layer 104 can be formed on the substrate 100 except for the substrate 100 where the fin structure 102 is formed thereon.

Figure 2:
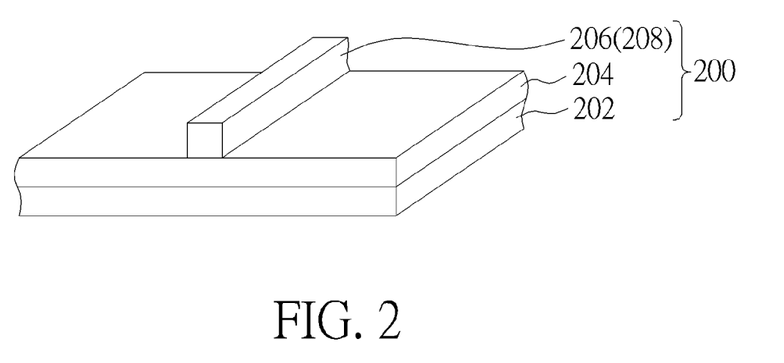

In another exemplary embodiment, as shown in FIG. 2, a substrate 200 as a silicon-on-insulator (SOI) substrate is provided, which includes a silicon substrate 202, a bottom oxide layer 204 located on the silicon substrate 202 and a silicon layer 206 located on the bottom oxide layer 204. The silicon layer 206 is patterned to form a fin structure 208 and a part of the bottom oxide layer 204 not overlapped by the fin structures 208 is exposed. In this way, the fin structure 208 can also be formed on the silicon substrate 202, and another oxide layer can be optionally further disposed on the silicon substrate 202 where the fin structure 208 is not formed thereon to serve as STI structure. The difference between FIG. 1 and FIG. 2 is that the insulating layer 104 formed on the silicon substrate 100 is located on the substrate 100 except for the part where the fin structure 102 is formed thereon (as shown in FIG. 1), but the bottom oxide layer 204 formed in the silicon-on-insulator substrate 200 has the fin structures 208 located thereon. This difference does not affect later semiconductor processes of the present invention. The embodiments illustrated above only serve as examples. The fin structure in the present invention can have a variety of embodiments, which are not described for the sake of simplicity. The following description is based on a single fin structure 102 of the embodiment shown in FIG. 1, but the semiconductor process of the present invention can also be applied to a substrate having the fin structure 208 or a plurality of fin structures.

Figure 3:
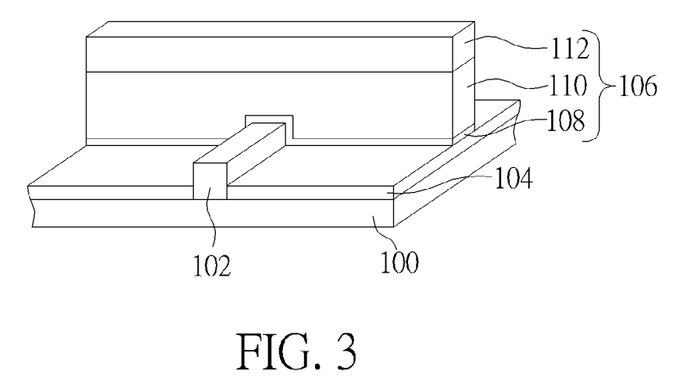

As shown in FIG. 3, a gate structure 106 partially overlapping the fin structure 102 is formed. The method of forming the gate structure 106 may include the following steps. At first, a gate dielectric material layer (not shown), a gate conductive material layer (not shown) and a cap material layer (not shown) are sequentially formed on the substrate 100. Then, a patterning process is preformed with a patterned photoresist layer (not shown) or a patterned layer as a mask. The gate dielectric material layer, the gate conductive material layer and the cap material layer can therefore be patterned to form the gate structure 106 including a gate dielectric layer 108, a gate conductive layer 110 and a cap layer 112, and the mask is removed. The material of the gate dielectric layer 108 may include silicon oxide (SiO), silicon nitride (SiN), silicon oxynitride (SiON), or a high-k dielectric material having a dielectric constant (k value) larger than 4 such as metallic oxide, etc. The metallic oxide used as the material of the gate dielectric layer 108 may be selected from hafnium oxide (HfO$_2$), hafnium silicon oxide (HfSiO$_4$), hafnium silicon oxynitride (HfSiON), aluminum oxide (Al$_2$O$_3$), lanthanum oxide (La$_2$O$_3$), tantalum oxide (Ta$_2$O$_5$), yttrium oxide (Y$_2$O$_3$), zirconium oxide (ZrO$_2$), strontium titanate oxide (SrTiO$_3$), zirconium silicon oxide (ZrSiO$_4$), hafnium zirconium oxide (HfZrO$_4$), strontium bismuth tantalate (SrBi$_2$Ta$_2$O$_9$, SBT), lead zirconate titanate (PbZr$_x$Ti$_{1-x}$O$_3$, PZT), barium strontium titanate (Ba$_x$Sr$_{1-x}$TiO$_3$, BST) or a combination thereof. The material of the gate conductive layer 110 may include undoped polysilicon, heavily doped polysilicon, or one or a plurality of metal layers such as a work function metal layer, a barrier layer and a low-resistance metal layer, etc. The cap layer 112 may include a single-layer structure or multi-layer structure made of dielectric materials such as silicon oxide (SiO), silicon nitride (SiN), silicon carbide (SiC), silicon carbonitride (SiCN), silicon oxynitride (SiON) or a combination thereof. In this exemplary embodiment, the formed gate structure 106 includes the gate dielectric layer 108 made of silicon oxide, the gate conductive layer 110 made of doped polysilicon and the cap layer 112 made of a silicon nitride layer and a silicon oxide layer sequentially disposed on the gate conductive layer, but is not limited thereto. Various metal gate processes may be used in the present invention, including a gate-first process, a high-k first process integrated into the gate-last process, and a high-k last process integrated into the gate-last process. As the gate conductive layer 110 of the gate structure 106 includes a polysilicon layer, a replacement metal gate (RMG) process, such as a gate-last process, can be later performed to replace the polysilicon layer with a metal layer.

Figure 4:
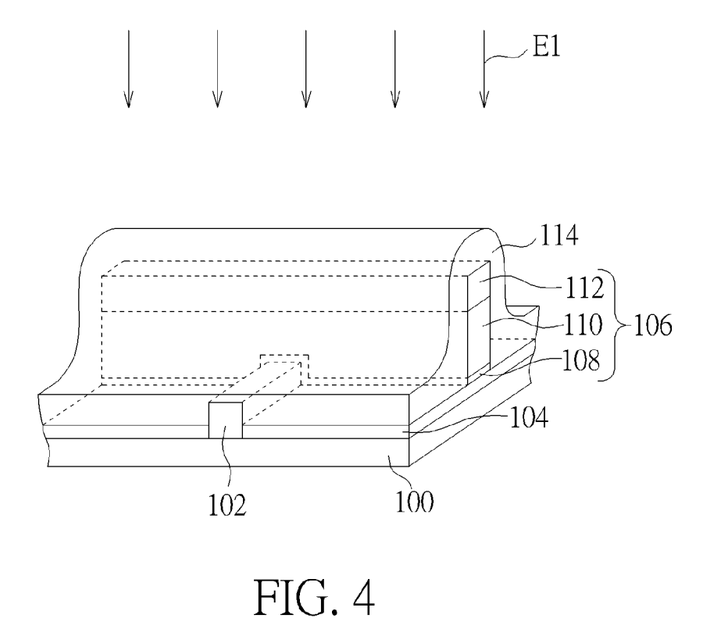

As shown in FIG. 4, a dielectric layer 114 is formed on the substrate 100 to cover the fin structure 102, the insulating layer 104 and the gate structure 106. The dielectric layer 114 may include a single-layer structure or multi-layer structure made of dielectric materials such as silicon oxide (SiO), silicon nitride (SiN), silicon carbide (SiC), silicon carbonitride (SiCN), silicon oxynitride (SiON) or a combination thereof. In addition, the material of the dielectric layer 114 is preferably different from the material of a top of the cap layer 112; therefore, in this exemplary embodiment, the dielectric layer 114 is made of silicon carbonitride (SiCN) through atomic layer deposition (ALD) process, but is not limited thereto.

Figure 5:
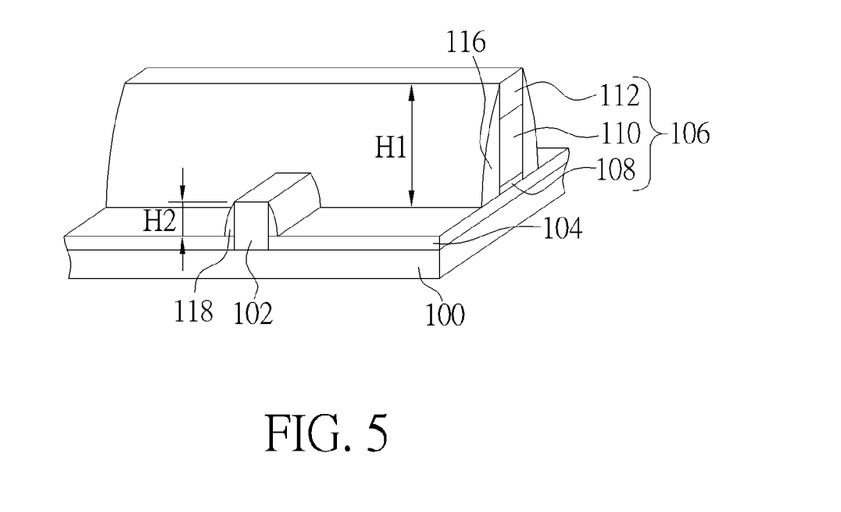

Please refer to FIG. 4 and FIG. 5 together. Subsequently, a first etching process E1 serving as a main etching process is performed to remove a part of the dielectric layer 114 to form a first spacer 116 surrounding the gate structure 106 and a second spacer 118 surrounding a sidewall of the fin structure 102. The first etching process E1 may be a dry etching process, a wet etching process or a combination thereof. In this exemplary embodiment, the process gas of the first etching process E1 includes methyl fluoride (CH$_3$F) and oxygen (O$_2$). The first spacer 116 aligned with the cap layer 112 of the gate structure 106 partially overlaps the fin structure 102. More specifically, the formed first spacer 116, which may serve as a gate spacer, surrounds the gate structure 106 and overlaps the sidewalls of the gate structure 106, and overlaps a part of the fin structure 102 adjacent to the gate structure 106; in particular, it overlaps a part of a top surface of the fin structure 102. Furthermore, the second spacer 118 beside the sidewall of the fin structure 102 does not cover the fin structure 102, and particularly does not overlap a top surface of the fin structure 102. More specifically, the formed second spacer 118 surrounds the fin structure 102 and overlaps the sidewalls of the fin structure 102, but does not cover the gate structure 106 and the first spacer 116. A height H1 of the first spacer 116 is substantially higher than a height H2 of the second spacer 118.

Figure 6:
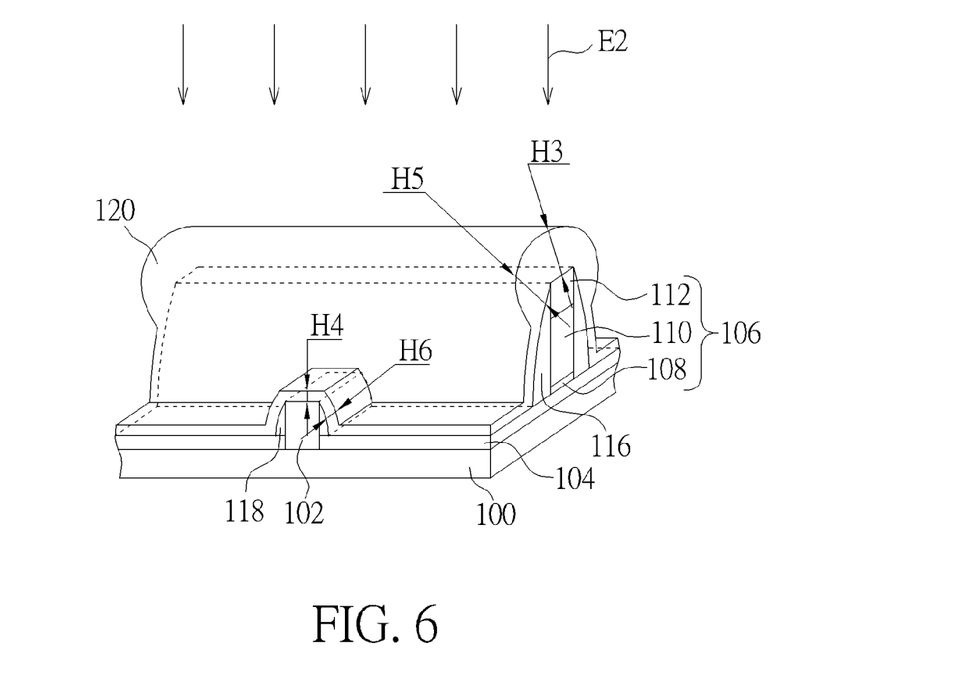

As shown in FIG. 6, a deposition process is performed in the same reaction chamber where the first etching process E1 is performed to further form a protective layer 120 on the substrate 100, and the protective layer 120 formed in-situ at least covers the gate structure 106 and the first spacer 116. Therefore, a top of the gate structure 106 and the first spacer 116 adjacent to the top of the gate structure 106 can be covered. The protective layer 120 preferably has a non-uniform thickness, that is, a thickness of the protective layer 120 covering the fin structure 102 and the second spacer 118 is preferably smaller than a thickness of the protective layer 120 covering the gate structure 106 and the first spacer 116, especially, a thickness H3 of the protective layer 120 covering a top of the gate structure 106 is substantially larger than a thickness H4 of the protective layer 120 covering a top of the fin structure 102, in order to make sure that the gate structure 106 and the first spacer 116 can still be covered by the protective layer 120 during later etching processes, such as the process of removing the second spacer 118. The process gas of forming the protective layer 120 may include methyl fluoride ($CH_3F$) or methane ($CH_4$). In this exemplary embodiment, a plasma enhanced chemical vapor deposition (PECVD) process is performed and the process gas including a main reacting gas such as methyl fluoride ($CH_3F$) and a dilute gas (or a carrier gas) such as argon, helium or a combination thereof is used to form the protective layer 120 having a non-uniform thickness, in which the protective layer 120 is a polymer layer and a material of the protective layer 120 is different from a material of the dielectric layer 114 (i.e. a material of the first spacer 116 and the second spacer 118). Furthermore, the protective layer 120 simultaneously covers the gate structure 106, the first spacer 116, the fin structure 102 and the second spacer 118, and a thickness H5 of the protective layer 120 covering the first spacer 116 adjacent the top of the gate structure 106 is substantially larger than a thickness HE of the protective layer 120 covering the second spacer 118 correspondingly adjacent the top of the fin structure 102. Moreover, as the protective layer covers multiple gate structures, the thickness of the protective layer covering the gate structure and a top of the first spacer is preferably smaller than half the interval (the pitch) of two neighboring gate structures in order to avoid overhang from occurring at the top of the opening between the two neighboring gate structures. Therefore, the protective layer at the bottom of the opening can be properly removed in the later processes.

Figure 7:
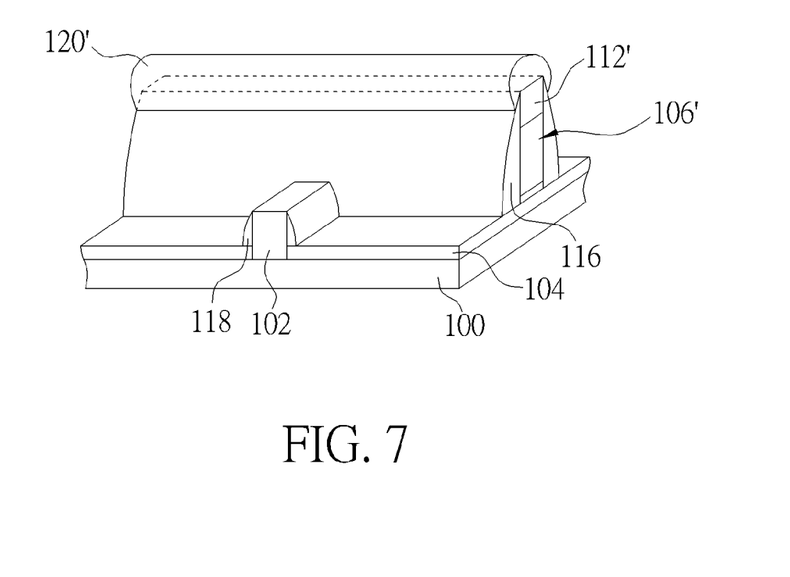

In another exemplary embodiment, as shown in FIG. 7, a material of the exposed gate structure 106', for example, a material of the cap layer 112', is different from a material of the dielectric layer 114 (i.e. a material of the first spacer 116 and the second spacer 118), a material of fin structure 102 and a material of the exposed substrate 100. As the process gas is only reactive to the material of the exposed gate structure 106', it can be used to perform a selective deposition process to form the protective layer 120' only covering the gate structure 106' and the first spacer 116 instead of simultaneously covering the gate structure 106', the first spacer 116, the second spacer 118 and the fin structure 102.

Figure 8:
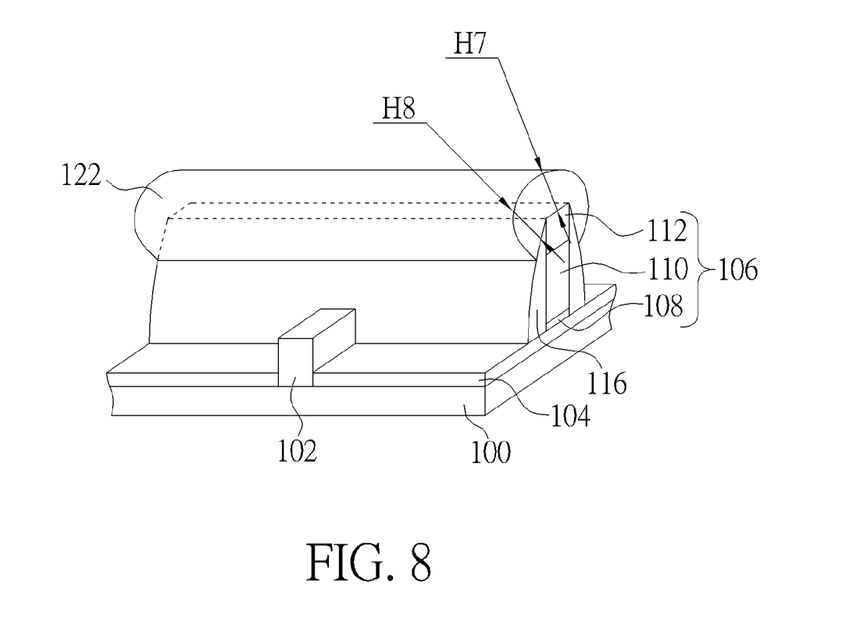

Please refer to FIG. 6 and FIG. 8 together. A second etching process E2 serving as an over etching process is performed to remove apart of the protective layer 120 and totally remove the second spacer 118. The totally removal of the second spacer 118 can avoid the recess deformation or the epitaxial layer deformation in the later source/drain region epitaxial layer processes. The second etching process E2 may be a dry etching process, a wet etching process or a combination thereof. In this exemplary embodiment, the process gas of the second etching process E2 comprises methyl fluoride ($CH_3F$) and carbon dioxide ($CO_2$). After performing the second etching process E2, the protective layer 120 covering the second spacer 118 and the fin structure 102 is removed, and the thickness of the protective layer 120 covering the first spacer 116 and the gate structure 106 is decreased to form a remaining protective layer 122. In other words, a thickness H7/H8 of the protective layer 120 after the second etching process E2 (i.e. the remaining protective layer 122) may be substantially smaller than the corresponding thickness H3/H5 of the protective layer 120 before the second etching process E2.

It can be appreciated that, the second etching process E2 is preferably performed in the same reaction chamber where the first etching process E1 and the step of forming the protective layer 120 are performed, and the process gas of the first etching process E1, the process gas of forming the protective layer 120 and the process gas of the second etching process E2 preferably includes the same gas. In this exemplary embodiment, the same gas is methyl fluoride ($CH_3F$), in order to save the manufacturing consuming time; for example, to save the tool transfer consuming time or the gas valve transfer consuming time. The process gas of the first etching process E1 is different from the process gas of the second etching process E2, and an etching rate of the material of the dielectric layer 114 of the first etching process E1 is substantially larger than an etching rate of the material of the dielectric layer 114 (i.e. a material of the first spacer 116 and the second spacer 118) of the second etching process E2. Therefore, the first etching process E1 may serve as a main etching process to form the gate spacer such as the first spacer 116, and the second etching process E2 may serve as an over etching process to remove an unwanted dielectric layer 114 remains at the sidewall of the fin structure 102 such as the second spacer 118 without damaging the first spacer 116. In one exemplary embodiment, the first etching process E1 including the process gas $CH_3F$ and $O_2$ may have an etching rate of 200 angstroms per minute (200 Å/min) to the material of the dielectric layer 114 such as SiN, while the second etching process E2 including the process gas $CH_3F$ and $CO_2$ may have an etching rate of 100 angstroms per minute (100 Å/min) to the material of the dielectric layer 114 (i.e. the first spacer 116 and the second spacer 118) such as SiN. Furthermore, an etching rate of 400 angstroms per minute (400 Å/min) to the polymer protective layer 122 which is formed through a main reacting gas such as methyl fluoride ($CH_3F$) of the second etching process E2 is smaller than an etching rate of 2000 angstroms per minute (2000 Å/min) of the first etching process E1 to the polymer protective layer 122. The etching rate to the material of the dielectric layer 114 and the etching rate to the material of the protective layer 120 of the first etching process E1 are both higher than those of the second etching process E2, but this is not limited therein.

Moreover, the protective layer 120 having a non-uniform thickness, for example, the thickness H5 of the protective layer 120 covering the first spacer 116 is substantially larger than the thickness H6 of the protective layer 120 covering the second spacer 118. This can help to form the remaining protective layer 122 on the first spacer 116 and the gate structure 106 after the second etching process E2 to prevent excess loss of the first spacer 116 during the second etching process E2. Accordingly, the difference in etching selectivity between the first etching process E1 and the second etching process E2 and the disposition of the protective layer 120 may jointly facilitate the light spacer pull down.

Figure 9:
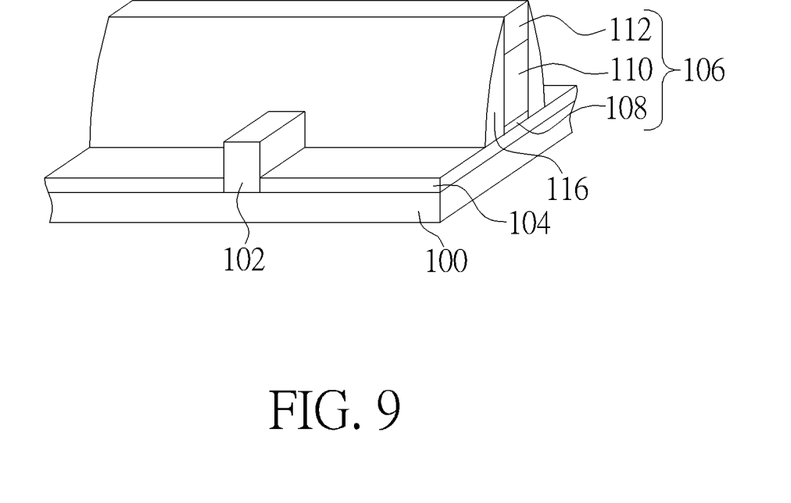

As shown in FIG. 9, the remaining protective layer 122 can be further removed by oxygen ($O_2$) plasma to expose the gate structure 106 and the first spacer 116 after performing the second etching process E2. This step of removing the remaining protective layer 122 is also preferably performed in the same reaction chamber where the first etching process E1, the step of forming the protective layer 120 and the second etching process E2 are performed to reduce manufacturing consuming time. This step of removing the remaining protective layer 122 can also be combined with the step of removing the photo resist layer covering one active region, such as an NMOS or PMOS region, after the source/drain region epitaxial layer process performed in another active region such as a PMOS or NMOS region.

In conclusion, the present invention uses multiple etching processes including a first etching process (a main etching process) to form a first spacer (the gate spacer) and a second etching process (an over etching process) to totally remove a second spacer (an unwanted spacer material remains at the sidewall of the fin structure). Furthermore, between the first etching process and the second etching process, a protective layer is formed to protect the first spacer in order to prevent serious spacer pull down during the second etching process. The first etching process, the protective layer formation process and the second etching process are preferably performed in the same reaction chamber to save on manufacturing consuming time. Accordingly, after the multiple etching processes, the first spacer (the gate spacer) can be properly formed beside the gate structure without exposing the gate conductive layer of the gate structure, and the unwanted second spacer at the sidewall of the fin structure can be totally removed.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of forming a semiconductor device, comprising:
    providing at least a fin structure on a substrate;
    forming a gate structure partially overlapping the fin structure;
    forming a dielectric layer on the substrate;
    performing a first etching process to remove a part of the dielectric layer to form a first spacer surrounding the gate structure and a second spacer surrounding a sidewall of the fin structure;
    in-situ forming a protective layer covering the gate structure and the first spacer; and
    performing a second etching process to remove a part of the protective layer and totally remove the second spacer.

2. The method of forming a semiconductor device according to claim 1, wherein the first etching process, the step of forming the protective layer and the second etching process are performed in a same reaction chamber.

3. The method of forming a semiconductor device according to claim 1, further comprising removing a remaining protective layer to expose the gate structure and the first spacer after performing the second etching process.

4. The method of forming a semiconductor device according to claim 3, wherein the first etching process, the step of forming the protective layer, the second etching process and the step of removing the remaining protective layer are performed in a same reaction chamber.

5. The method of forming a semiconductor device according to claim 1, wherein a process gas of the first etching process is different from a process gas of the second etching process.

6. The method of forming a semiconductor device according to claim 5, wherein the process gas of the first etching process comprises methyl fluoride ($CH_3F$) and oxygen ($O_2$).

7. The method of forming a semiconductor device according to claim 5, wherein the process gas of the second etching process comprises methyl fluoride ($CH_3F$) and carbon dioxide ($CO_2$).

8. The method of forming a semiconductor device according to claim 1, wherein a process gas of forming the protective layer comprises methyl fluoride ($CH_3F$) or methane ($CH_4$).

9. The method of forming a semiconductor device according to claim 8, wherein the process gas of forming the protective layer further comprises argon, helium or a combination thereof.

10. The method of forming a semiconductor device according to claim 1, wherein a process gas of the first etching process, a process gas of forming the protective layer and a process gas of the second etching process comprise a same gas.

11. The method of forming a semiconductor device according to claim 10, wherein the same gas comprises $CH_3F$.

12. The method of forming a semiconductor device according to claim 1, wherein an etching rate of a material of the dielectric layer of the first etching process is substantially larger than an etching rate of a material of the dielectric layer of the second etching process.

13. The method of forming a semiconductor device according to claim 12, wherein the material of the dielectric layer comprises silicon nitride (SiN) or silicon carbonitride (SiCN).

14. The method of forming a semiconductor device according to claim 1, wherein the protective layer simultaneously covers the second spacer, and a thickness of the protective layer covering the first spacer is substantially larger than a thickness of the protective layer covering the second spacer.

15. The method of forming a semiconductor device according to claim 14, wherein after performing the second etching process, the protective layer covering the second spacer is removed, and the thickness of the protective layer covering the first spacer is decreased.

16. The method of forming a semiconductor device according to claim 1, wherein a material of the dielectric layer is different from a material of the protective layer.

17. The method of forming a semiconductor device according to claim 1, wherein the protective layer comprises a polymer layer.

18. The method of forming a semiconductor device according to claim 1, wherein a plasma enhanced chemical vapor deposition (PECVD) process is performed to form the protective layer.

19. The method of forming a semiconductor device according to claim 1, wherein the gate structure comprises a gate dielectric layer, a gate conductive layer and a cap layer.

20. The method of forming a semiconductor device according to claim 19, wherein the cap layer comprises a silicon nitride layer and a silicon oxide layer sequentially disposed on the gate conductive layer.

* * * * *